(12) United States Patent
Yap et al.

(10) Patent No.: US 12,217,811 B2
(45) Date of Patent: Feb. 4, 2025

(54) PROGRAMMABLE LOGIC DEVICE WITH DESIGN FOR TEST FUNCTIONALITY

(71) Applicant: QuickLogic Corporation, San Jose, CA (US)

(72) Inventors: Ket Chong Yap, San Jose, CA (US); Chihhung Liao, Fremont, CA (US); Shieh Huan Yen, New Taipei (TW)

(73) Assignee: QuickLogic Corporation, San Jose, CA (US)

( * ) Notice: Subject to any disclaimer, the term of this patent is extended or adjusted under 35 U.S.C. 154(b) by 0 days.

(21) Appl. No.: 18/504,078

(22) Filed: Nov. 7, 2023

(65) Prior Publication Data
US 2024/0170087 A1 May 23, 2024

Related U.S. Application Data

(63) Continuation of application No. 17/714,136, filed on Apr. 5, 2022, now Pat. No. 11,848,066.

(51) Int. Cl.
*G11C 29/32* (2006.01)
*G11C 29/12* (2006.01)
*G11C 29/20* (2006.01)
*H03K 19/173* (2006.01)
*H03K 19/17728* (2020.01)

(52) U.S. Cl.
CPC .......... *G11C 29/32* (2013.01); *G11C 29/1201* (2013.01); *G11C 29/20* (2013.01); *H03K 19/1737* (2013.01); *H03K 19/17728* (2013.01); *G11C 2029/1202* (2013.01); *G11C 2029/1204* (2013.01); *G11C 2029/3202* (2013.01)

(58) Field of Classification Search
None
See application file for complete search history.

(56) References Cited

U.S. PATENT DOCUMENTS

| | | | | |
|---|---|---|---|---|
| 4,947,357 | A * | 8/1990 | Stewart | G01R 31/318558 702/118 |
| 6,968,487 | B1 * | 11/2005 | Bryant | G06F 30/394 716/132 |
| 8,108,742 | B2 * | 1/2012 | Whetsel | G01R 31/3172 714/732 |
| 10,523,209 | B1 * | 12/2019 | Wang | H03K 19/1737 |
| 10,579,454 | B2 * | 3/2020 | Acharya | G11C 29/20 |

(Continued)

*Primary Examiner* — Guerrier Merant
(74) *Attorney, Agent, or Firm* — Seed IP Law Group LLP

(57) ABSTRACT

A programmable logic device (PLD) supports scan testing of configurable logical blocks using scannable word line (WL) shift register (WLSR) chains to enable writes to configurable memory bits while scan test data is input via a scan chain comprising scannable bit line (BL) shift registers (BLSRs). Input test data may be shifted onto BLs to write data into a configurable memory bit when a corresponding WL associated with the configurable memory bit is asserted. Logic blocks may comprise: latch-based configurable memory bits, scannable WLSRs forming a distinct WLSR chain in shift mode and driving corresponding WLs. Each WL, when asserted, enables writes to a corresponding configurable memory bit. A scannable BLSR receives serial scan test vector input in shift mode and drives a corresponding BL coupled to the configurable memory bit to write data to the configurable memory bit when the associated WL is asserted.

20 Claims, 8 Drawing Sheets

(56) References Cited

U.S. PATENT DOCUMENTS

| | | | |
|---|---|---|---|
| 2007/0011539 A1* | 1/2007 | Syed | G01R 31/318519 |
| | | | 714/733 |
| 2012/0196409 A1* | 8/2012 | Or-Bach | H03K 19/17748 |
| | | | 257/E21.597 |
| 2017/0373692 A1* | 12/2017 | Devlin | G01R 31/3177 |

* cited by examiner

PROGRAMMABLE LOGIC DEVICE WITH DESIGN FOR TEST FUNCTIONALITY

TECHNICAL FIELD

The present invention relates to an integrated circuit that includes a programmable logic device (PLD), such as a field programmable gate array (FPGA), and to circuitry to facilitate design for test functionality including scan testing of PLDs.

BACKGROUND

The semiconductor industry is driven by a desire to provide higher levels of integration. With higher levels of integration, silicon space and cost are reduced while performance and reliability are increased. Unfortunately, higher levels of integration lead to greater specificity. For example, application specific integrated circuits (ASICs) are highly specific devices that often serve the needs of a small set of customers. To ensure that ASICs function correctly when manufactured, design for test (DFT) features can be incorporated into the ASIC.

For example, boundary scan may be used to test functional blocks, interconnects between the functional blocks, pin states, etc. in an ASIC. To facilitate boundary scan, "scan cells" are incorporated into a device, which are connected to pins on the device and, when enabled (e.g. in a "test mode"), can override pin functionality. When disabled the scan cells do not affect device operation or functionality. Conventionally, the scan cells are linked together to form a scan chain, which enables a data stream to be shifted serially from one cell to the next in sequence. Once a data word has been shifted into the scan cells, it can be loaded into on-chip registers to test the ASIC, for example, by exercising functional blocks on the chip and monitoring output. In an ASIC, the functional blocks and routing are largely fixed and/or known in advance so by using appropriate test patterns or "test vectors" large sections of the ASIC can be tested.

Programmable logic devices, such as field programmable gate arrays (FPGAs), are versatile integrated circuit chips, which have internal circuitry logic with user selected connections that a user can configure to realize user-specific functions. While programmable logic is versatile, there can be significant design challenges related to incorporating desired logic for a specified die size, routing signals, signal stability, etc. when large complex functions are mapped onto a silicon platform that includes programmable logic.

For example, FPGAs may use storage elements to configure the FPGA, such as when routing through multiplexers ("muxes"), or when defining a function via a look up table (LUT). Conventionally, the storage configurable elements used are Static Random Access Memory (SRAM) cells, latches, or registers. These configurable elements may be distributed throughout the design and may take the form of an array. Configurable elements may be used to program FPGA routing interconnects and/or FPGA configurable logic blocks (CLBs) that are used to implement logic functions.

Thus, while FPGAs provide flexibility, testing FPGA devices can present challenges. Because FPGAs can be programmed to implement a variety of functions, the FPGA manufacturer cannot know which of the (potentially billions) of possible logic and/or routing resources will be used. Therefore, testing at the manufacturer may be limited to a small number of test configurations. Additional testing may be performed once an FPGA has been programmed to realize specified functionality. Thus, provision of features to facilitate standardized testing subsequent to programming and/or configuration is desirable.

Accordingly, some disclosed embodiments facilitate design for test functionality in FPGAs that can help test for proper functioning when the devices are programmed.

SUMMARY

Some disclosed embodiments pertain to a programmable logic device (PLD) comprising: (i) a scan enable input, wherein, when the scan enable input is asserted, the PLD enters a shift mode; and (ii) at least one first logic block section. In some embodiments, the at least one first logic block section may comprise: a plurality of latch-based configurable memory bits, a plurality of linked scannable word line shift registers (WLSRs), wherein the plurality of linked scannable WLSRs form part of a first scan chain in shift mode, a plurality of word lines (WLs), wherein each WL is: (a) associated with at least one corresponding configurable memory bit, and (b) enables writes to the at least one corresponding configurable memory bit when the associated WL is asserted by a corresponding scannable WLSR in the plurality of scannable WLSRs, at least one scannable bit line shift register (BLSR) to receive a section of a scan test vector in shift mode, and at least one bit line (BL) coupled to the plurality of configurable memory bits and driven by the at least one scannable BLSR, wherein, when the PLD is in shift mode, data on the BL is written into a corresponding configurable memory bit when the associated WL is asserted.

Some embodiments pertain to a method of testing a programmable logic device (PLD), wherein the PLD may comprise a scan enable input, and at least one logic block section. The at least one logic block section may comprise: a plurality of latch-based configurable memory bits; a plurality of scannable word line shift registers (WLSRs), wherein the plurality of scannable WLSRs form a first scan chain in shift mode, a plurality of word lines (WLs), wherein each WL is: (a) associated with at least one corresponding configurable memory bit, and (b) enables writes to the at least one corresponding configurable memory bit when the associated WL is asserted by a corresponding WLSR in the plurality of WLSRs; at least one scannable bit line shift register (BLSR) to receive a section of a scan test vector in shift mode; and at least one bit line (BL) coupled to the plurality of configurable memory bits and driven by the at least one scannable BLSR. The method of testing the PLD may comprise: asserting the scan enable input to place the PLD in a shift mode; storing the received section of a scan test vector into the at least one scannable BLSR; and writing a corresponding sub-section of the scan test vector into a corresponding configurable memory bit by shifting the corresponding sub-section of the scan test vector from the at least one BLSR onto the at least one BL while asserting a corresponding WL associated with the corresponding configurable memory bit.

Some disclosed embodiments also pertain to an integrated circuit (IC) comprising: a programmable logic device (PLD), wherein the PLD may comprise: (i) a scan enable input, wherein, when the scan enable input is asserted, the PLD enters a shift mode; and (ii) at least one first logic block section. The at least one first logic block section may comprise: a plurality of latch-based configurable memory bits, a plurality of linked scannable word line shift registers (WLSRs), wherein the plurality of scannable WLSRs form a distinct chain in shift mode, a plurality of word lines (WLs), wherein each WL is: (a) associated with at least one corresponding configurable memory bit, and (b) enables writes to the at least one corresponding configurable memory bit when the associated WL is asserted by a corresponding scannable WLSR in the plurality of scannable WLSRs, at least one scannable bit line shift register (BLSR) to receive a section of a scan test vector in shift mode, and at least one bit line (BL) coupled to the plurality of configurable memory bits and driven by the at least one scannable BLSR, wherein, when the PLD is in shift mode, data on the BL is written into the corresponding configurable memory bit when the associated WL is asserted.

BRIEF DESCRIPTION OF THE DRAWINGS

Disclosed embodiments will be described, by way of example only, with reference to the drawings.

Like reference numbers and symbols in the various figures indicate like elements, in accordance with certain example embodiments. In addition, multiple instances of a functional element may be indicated by following a first number for the element with a letter or with a hyphen and a second number. For example, multiple instances of an element 620 may be indicated as 620-1, 620-2, 620-3 etc. In some instances, the suffixes may refer to the same element but in a different state and/or at a different time and/or associated with multiple other elements. When referring to such an element using only the first number, any instance of the element is to be understood (e.g. element 620 in the previous example would refer to elements 620-1, 620-2, and/or 620-3).

DETAILED DESCRIPTION

In the description, the terms "1", "one", "high", "logic 1", "logic one", and "logic high" refer to logic signal levels that are above some threshold voltage and sensed by logic circuitry to be a Boolean 1, whereas the terms "0", "zero", "low", "logic zero", "logic 0", "and logic low" refer to logic signal levels that are below some threshold voltage and sensed by logic circuitry to be a Boolean 0. The term "asserted" refers to an activation of a signal (e.g., the signal is interpreted as being true without regard to the logic level of the signal in question), whereas the term "de-asserted" refers to an inactivation of a signal (e.g., the signal is interpreted as being false regardless of logic level of the signal in question).

Figure 1A:
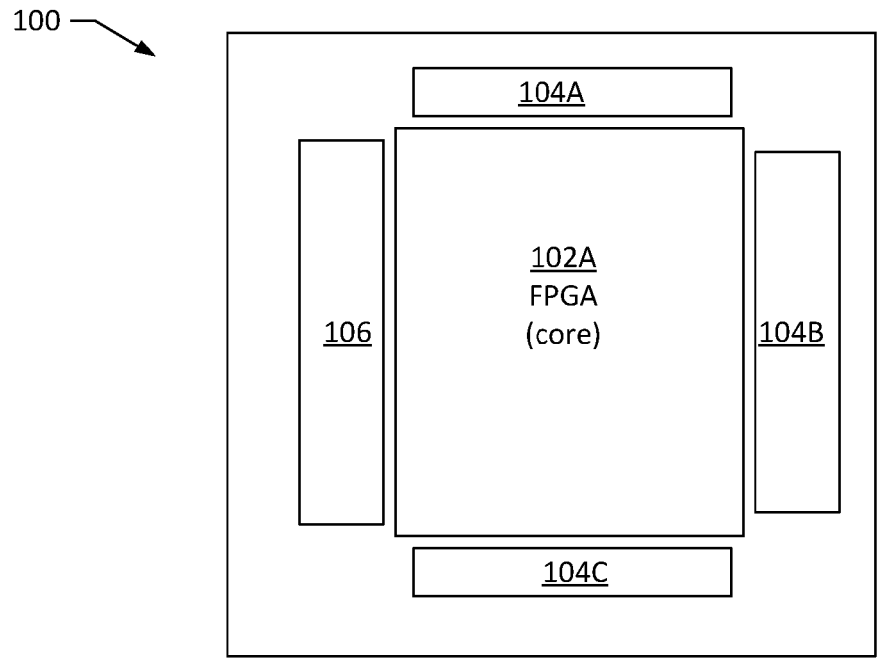
FIGS. 1A and 1B show simplified schematics of a programmable logic device (PLD) such as a field programmable gate array (FPGA) or other circuitry having user programmable circuit connections.
Figure 1B:
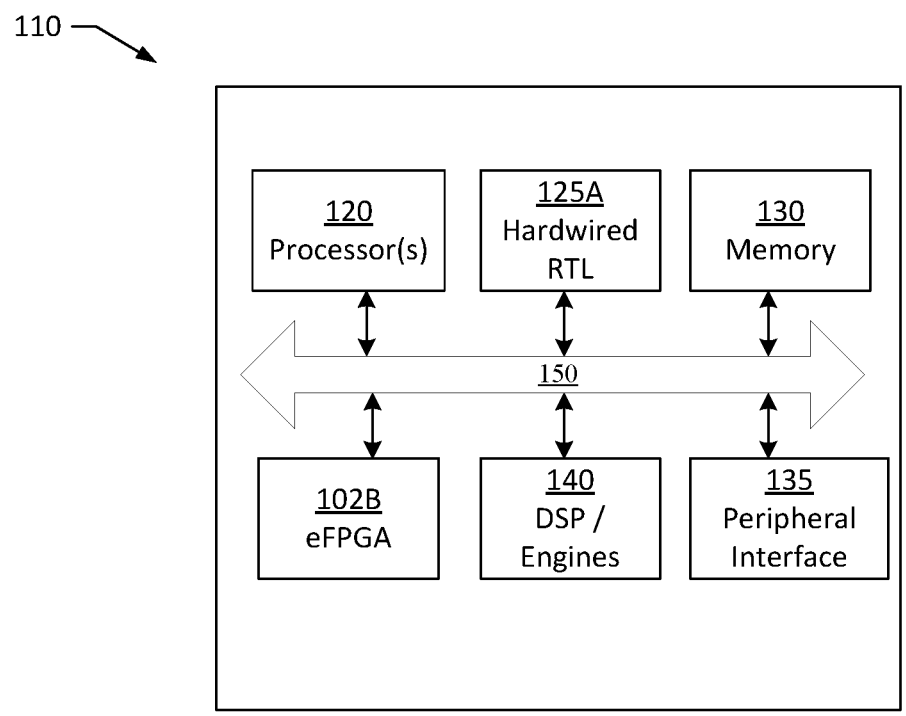

FIGS. 1A and 1B show simplified block diagrams of example Integrated Circuit (IC) chip 100 that may include programmable logic devices (PLD) 102 such as a field programmable gate array (FPGA) (e.g., 102A or 102B), and/or other circuitry having user programmable circuit connections. For simplicity and ease of description, the term "FPGA" may refer to any programmable logic device. Accordingly, while a programmable logic device described herein may be referred to as FPGA 102, it should be understood that other alternative types of programmable logic devices may also be used, such as Simple PLDs (SPLDs), Complex PLDs (CPLDs), Programmable Array Logic (PAL), etc.

As used herein, FPGA 102 may be a standalone FPGA 102A and/or take the form of an embedded FPGA (eFPGA) 102B. eFPGAs 102B may be viewed as fully integrated programmable logic Intellectual Property (IP) cores that form part of an ASIC or a System on a Chip (SoC). The term IP core refers to a reusable unit of logic, cell, circuit, or design element. IP cores are often licensed by an owning entity to another entity as a turnkey solution that provides some desired functionality. ASIC and/or SoCs with eFPGAs increase flexibility by facilitating combination of circuit/logic elements that that can be updated (e.g., associated with the eFPGA) with other elements of the ASIC/SoC.

As shown in FIG. 1A, a standalone Integrated Circuit (IC) chip 100 may include an FPGA core 102A. FPGA core 102A may be coupled to General Purpose Input/Output (GPIO) blocks 104 (shown as 104A, 104B, and 104C in FIG. 1A) and to one or more specific or dedicated interface blocks 106 (e.g., PCI Express, Ethernet, etc.). A standalone FPGA in the form of IC 100 may include various other blocks and/or logic/circuit elements (not shown in FIG. 1A) and may be coupled to other components on a circuit board using pins on IC 100.

FIG. 1B shows another example IC 110, which may include eFPGA 102B. IC 110 may be an ASIC or SoC and may include one or more processors (and/or processor cores) 120, hardwired register-transfer level (RTL) blocks, memory 130, Digital Signal Processor (DSP)/Engines block 140, and peripheral interface(s) 135. The blocks shown in FIG. 1B may be coupled using bus 150. For example, processor 120 and DSP/Engines block 140 may implement various application specific functions and additional customizations may be added using eFPGA 102B. In some embodiments, eFPGA 102 may be used to customize and/or accelerate machine learning applications, encryption schemes, etc., which may be implemented by Processor 120 and/or DSP/Engines block 140. As another example, eFPGA 102B may be used to implement and update functions or algorithms in the field (e.g., on deployed systems), or to address different markets (e.g., where each market may have one or more distinct requirements) using the same device (e.g., IC 110). Advantageously, integrated circuit 110, which incorporates eFPGA 102B, may provide a user with the functionality, ease-of-use, and high performance found in a dedicated device, such as an ASIC, as well as the configurability and flexibility found in programmable logic.

Figure 2A:
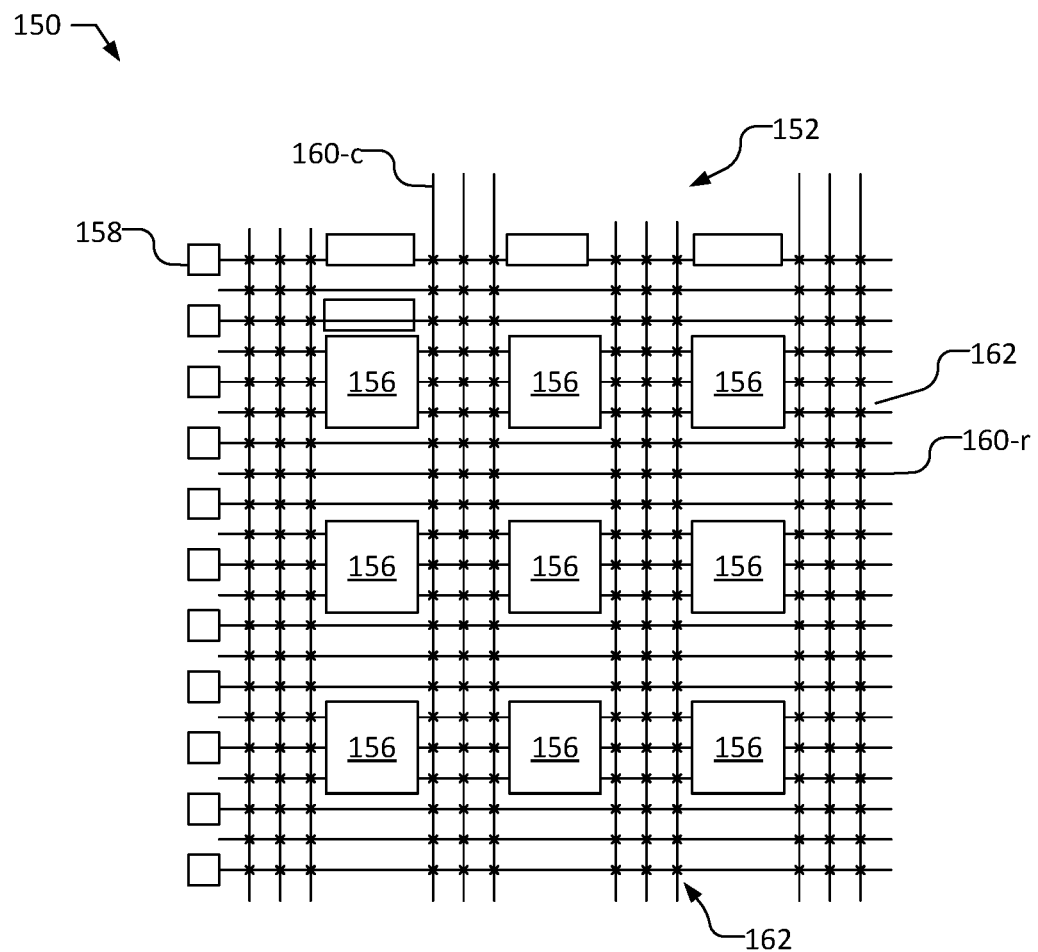
FIGS. 2A and 2B illustrate simplified schematics of a PLD in the form of an FPGA device such as the devices shown in FIGS. 1A and 1B.
Figure 2B:
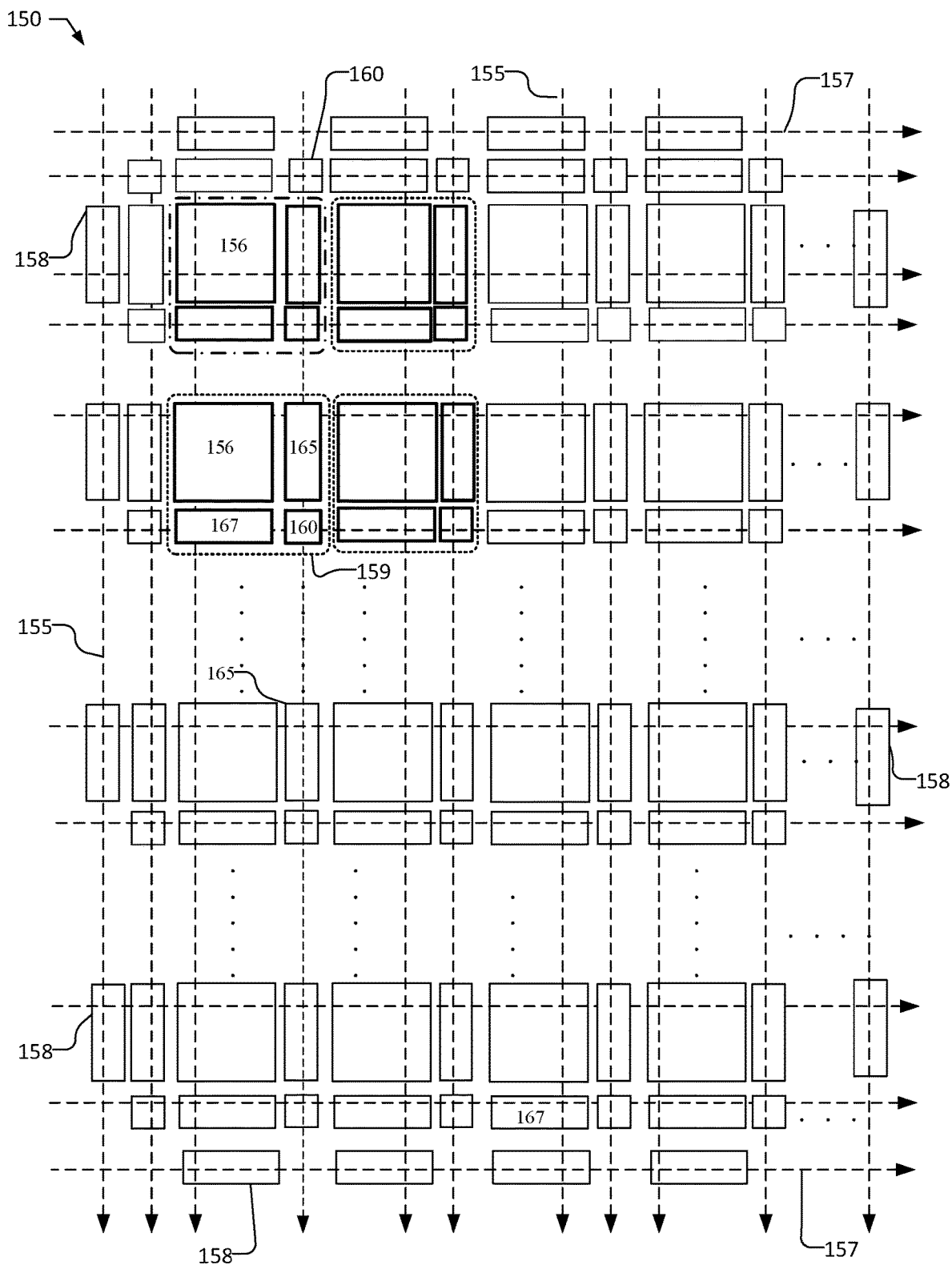

FIGS. 2A and 2B illustrate a simplified schematic of a PLD 150 in the form of an FPGA device (such as device 102A or 102B of FIG. 1A or 1B). FPGA device 150 may include an array 152 of programmable elements and conductors 160. In some instances, SRAM, antifuses, registers, or D-Latches 162, (shown marked by "x" in FIG. 2A), may be used to selectively connect conductors (e.g., horizontal conductors 160-r) with other conductors (e.g., vertical conductors 160-c). In FIGS. 2A and 2B the terms "vertical" and "horizontal" and/or "rows" and "columns" are merely used herein to facilitate identification of described elements in reference to the figures.

The array 152 of programmable elements (FIG. 2A), which is sometimes referred to as a programmable fabric, or programmable routing fabric is connected to a number of configurable logic blocks (CLBs) 156. Each CLB 156 may include a number of look up tables (LUTs), which may be configurable and/or programmable logic elements, which can be selectively combined to perform a desired function through the appropriate interconnection of conductors (e.g., by using registers and/or D-latches 162). In some embodiments, the LUTs in CLBs 156 may be implemented using latches. Each configurable LUT may be used to emulate some combinational function so that when using the inputs of the combinational function as LUT address bits, the memory bit storing the value of the function for each particular input combination may be read at the output of the LUT. As one example, the output of the LUT may be coupled to a latch. A mux may select the latch output or register (sequential logic) or LUT output (combinational logic) as the output of CLB 156. The output of CLB 156 may be connected to programmable routing fabric 152.

Input/output (I/O) circuits 158 provide an interface to external circuitry, i.e., off-chip circuitry and may facilitate access to internal resources via pins.

FIG. 2B shows another simplified schematic of FPGA device 150 (such as 102A or 102B of FIG. 1A or 1B) illustrating some other FPGA device elements. In some embodiments, depending on the size of FPGA 150, each CLB 156 may include and/or be associated with a plurality of configuration memories (e.g., hundreds or thousands of configuration memories), which are distributed over a large silicon area. Thus, a reasonable sized FPGA 150 may include millions of configuration memory bits. The configuration memories may be accessed using BLs 155 and WLs 157.

Programmable routing resource 152 may include a routing resources CBX 167 in the horizontal direction and CBY 165 in the vertical direction. Programmable routing resource 152 may facilitate the configuration of programmable switches and wiring segments, which determines interconnection between CLBs 156. Switch block (SB) 160 provides interconnections between the horizontal and vertical wire segments and the connection block (e.g. CBX 167 and CBY 165) provides input to the CLB block 156.

A CLB 156 and the associated CBX 167, CBY 165, and SB 160 (which are shown enhanced in FIG. 2B) with are also referred to as a tile or logic tile 159 (shown within the dashed block). As outlined above, Input/Output (I/O) circuits 158 (also referred to as General Purpose Input Output (GPIO) 158) may provide an interface to external off-chip circuitry and facilitate access to internal resources via pins.

Typically, BLs 155 and WLs 157 are made of a metal wire with the driver located in the FPGA array and/or along the perimeter.

Figure 3A:
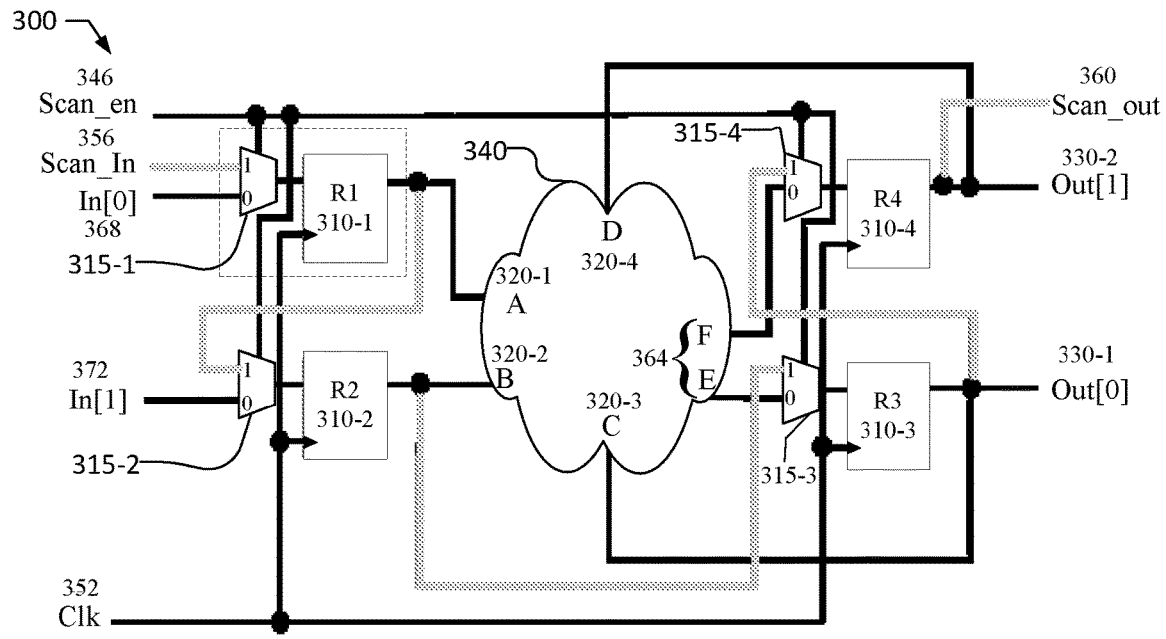
FIG. 3A shows a schematic of an example circuit that includes scan test circuitry.

FIG. 3A shows a schematic of an example circuit 300 that includes scan test circuitry. Scan testing involves a set of circuit elements termed a scan chain. A scan chain refers to circuit elements that are linked (as in a chain) so that the input of a first element in the chain is coupled to test data input and the output of each element is connected to next element in sequence. The last element in the scan chain may output all of the scan test data serially and is often coupled to Automatic Test Equipment (ATE), which may compare the actual output (once all of the scan test data is available) to expected data to detect faults. The scan input may also be coupled to ATE. ATE may input scan test data serially and the scan test data may be generated by Automatic Test Pattern Generator (ATPG) tools, which may also optimize the number of test patterns. The scan chain is enabled by asserting a scan enable signal, which may place a device into a shift mode. When scan enable is de-asserted, the device may enter a non-test or operating mode, where it may carry out usual functions.

Scan testing may be viewed as involving three phases: (i) a scan in phase, to input the test vector, (ii) a scan capture phase (e.g. when the device is placed into non-test or operating mode) and the test vector input (in the scan in phase) exercises the functional blocks and output is captured, and (iii) a scan out phase (e.g. when the device may be placed in shift mode again) and output data is shifted out. The term "scan test vector" refers to data shifted into the scannable WLSR, scannable BLSR, output scannable register and/or any scannable register used during test mode regardless of the number of scan chains in the PLD. Scan test vectors may be generated by ATPG tools.

As outlined above, the scan capture phase is also part of scan testing and facilitates capture of the operating mode. During scan testing, there may be two signals (a) a Scan_Mode signal and (b) a Scan_en signal. The Scan_Mode signal may switch control of the clock signal and reset/set signals to an external test signal (e.g. from ATE), while the Scan_en signal may determine whether a device is in shift mode. For ease of description, the device is assumed to be in "test mode" herein unless otherwise indicated. In test mode, the clock (e.g. Clk) and set/reset signals are controlled externally (e.g. by ATE) during the entirety of scan testing (regardless of whether Scan_en is asserted or de-asserted). The term "test mode," (e.g. when Scan_Mode is asserted) as used herein, thus, refers to the scan in, and/or scan capture, and/or scan out phases. The term "shift mode" (e.g. when Scan_en is asserted), which can occur while a device is in test mode, refers to the scan in and scan out phases, while "scan capture" mode refers to the scan capture phase (e.g. when Scan_en is de-asserted but Scan_mode remains asserted). As outlined above the output may be compared to expected output by ATE. In some instances, The scan in and scan out phases can be overlapped. FIG. 3A serves to illustrate working of scan test circuitry.

In FIG. 3A, when Scan_en input signal 346 is de-asserted: (a) circuit 300 is in a scan capture operation mode (b) input 0 on multiplexers (muxes) 315-1, 315-2, 315-3, and 315-4 is selected, (c) the thinner dark shaded path shown in FIG. 3A is activated, and (d) circuit logic block 340 operates on inputs A 320-1, B 320-2, C 320-3, and D 320-4 to generate outputs [E:F] 364, which may be stored in registers R3 310-3 and R4 310-4, respectively. Values in registers R3 310-3 and R4 310-4 may appear as output signals Out[0] 330-1 and Out[1] 330-2, respectively.

During scan capture operation (when Scan_en input signal 346 is de-asserted), input signals In[0] 368 and In[1] 372 may appear as inputs to registers 310-1 and 310-2, respectively. Values in registers R1 310-1 and R2 310-2 may appear as inputs A 320-1 and B 320-2 to logic block 340, while prior outputs Out[0] 330-1, and Out[1] 330-2 appear to logic block 340 as inputs C 320-3 and D 320-4, respectively. In FIG. 3A, R1 310-1, R2 310-2, R3 310-3, and R4 310-4 are 1-bit registers. Logic block 340 may implement any logic function.

In FIG. 3A, circuit 300 may be considered to be in a "shift mode" when Scan_en input signal 346 is asserted in test mode (e.g. as part of scan testing). Accordingly, when Scan_en input signal 346 is asserted, (a) circuit 300 is in shift mode (e.g. as part of scan testing), (b) input 1 on multiplexers (muxes) 315-1, 315-2, 315-3, and 315-4 is selected, (c) the thicker light shaded path shown in FIG. 3A is activated, and (d) at each clock cycle, data is shifted from: input Scan_In 356 to R1 310-1; output of R1 310-1 to R2 310-2; output of R2 310-2 to R3 310-3; output of R3 310-3 to R4 310-4; output of R4 310-4 to Scan_out 360. The path outlined in (d) above represents a scan chain. The grey thicker lines shown for the scan test path and the thin dark lines shown for the normal operation path are merely illustrative and sections of the scan test path and normal operation path may overlap.

To test logic block 340, with Scan_en 346 asserted, data may be serially input via Scan_in 356 and when inputs A 320-1, B 320-2, C 320-3, and D 320-4 correctly reflect a desired input, the scan test vector has been scanned in and scan in phase is complete.

Scan_en 346 may be de-asserted to switch the circuit to normal operation. As outlined above, during normal operation logic block operates on inputs A 320-1, B 320-2, C 320-3, and D 320-4 to produce output [E:F] 364 thereby completing the scan capture phase. During the period when Scan_en 346 is de-asserted, a clock (e.g. at a rising edge) is used to capture the data: (a) at nodes E and F into registers r3 310-3 and R4 310-4, respectively, and (b) from In[0] and In[1] into registers R1 310-1 and R2 310-2. respectively. For example, while logic block 340 operates on inputs (to generate outputs [E:F] 364), input signals In[0] 315-1 and In[1] 315-2 may reflect a primary input or the output of some other blocks and these paths may form part of the scan test.

Next, Scan_en 346 may be asserted so that circuit 300 reverts to shift mode and primary input In[0] 315-1 and In[1] 315-2 and output [E:F] 364 are captured in 310-1, 310-2, 310-3, 310-4, which are scanned out serially via Scan_out 360. Scan_out data 360 may be captured and compared to expected values using ATE (not shown in FIG. 3A) to detect errors. Upon output of the output signals (e.g. [E:F]), the scan out phase is complete and another test cycle may commence with a new test vector.

Each input set comprising A 320-1, B 320-2, C 320-3, and D 320-4 is termed a "test vector" and logic block 340 can be tested using several test vectors. For the simple example in FIG. 3A, 16 test vectors (all combination of the four inputs A 320-1, B 320-2, C 320-3, and D 320-4) can exhaustively test logic block 340 for all possible inputs. In general, however, there may be a large number of combinations and Automatic Test Pattern Generation (ATPG) tools (which may be part of and/or coupled to ATE) may be used to lower the number of test vectors used to test logic (e.g. logic block 340).

Figure 3B:
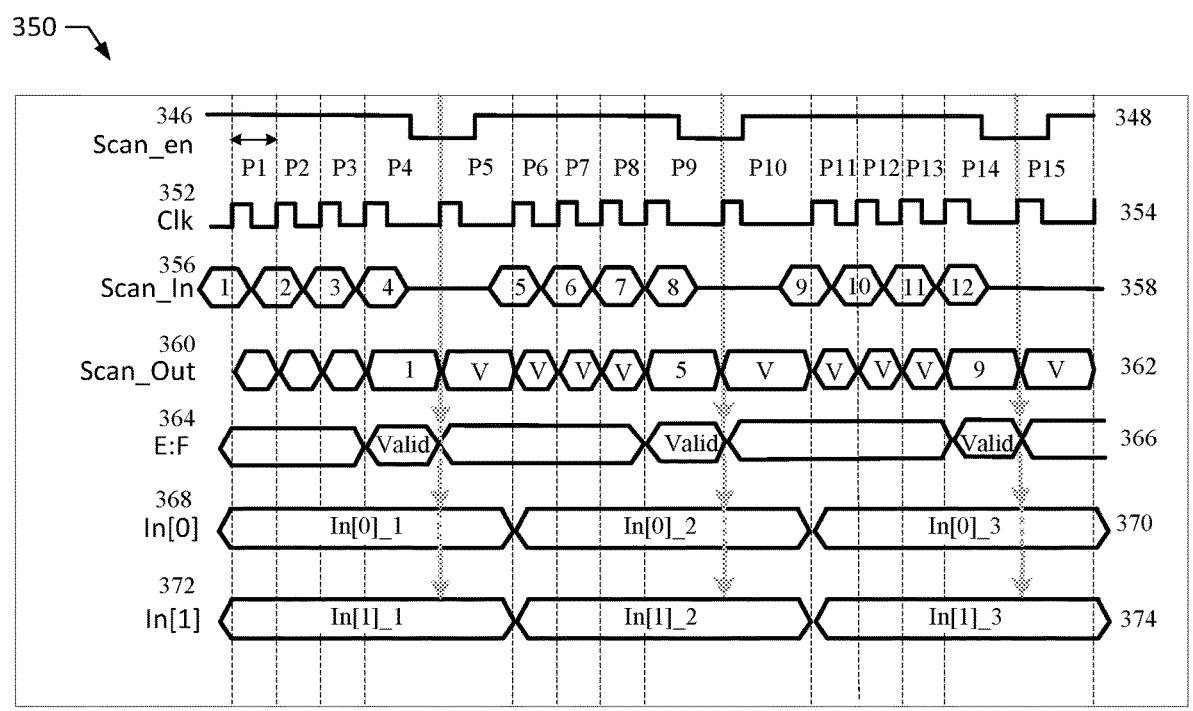
FIG. 3B shows timing diagram illustrating signal transitions associated with the circuit of FIG. 3A.

FIG. 3B shows timing diagram 350 illustrating signal transitions associated with circuit 300. Periods P1 through P13 are demarcated by dashed vertical lines and correspond to cycles of Clk signal 352. The heavier grey lines, each of which coincide with a rising edge of Clk signal 352, indicate times when data is captured at [E:F] 364 (waveform 366) as well as In[0] 368 (waveform 370) and In[1] 372 (waveform 374).

As shown in FIG. 3B, in waveform 348, Scan_en 346 is asserted from P1 to a time in P4 so circuit 300 is in shift mode and input signal Scan_in 356 propagates through the scan chain (e.g. from Scan_in 356 via mux 315-1 to R1 310-1 (and via mux 315-2) to R2 310-2 (and via mux 315-3) to R3 310-3 and (via mux 315-4) to R4 310-4) during the time when Scan_en 346 is asserted. Accordingly, in waveform 358, Scan_in 356 is shown with serial input data (indicated by labels 1, 2, 3, 4 during the time when Scan_en 346 is asserted.

Signals In[0] 368 and In[1] 372 may have data from P1 to a time in P5 (which overlaps with the time during which Scan_en 346 is asserted), as shown in waveforms 370 and 374, respectively. However, the data on In[0] 368 and In[1] 372 (which are coupled to input 0 of muxes 315-1 and 315-2, respectively) are ignored during the time when Scan_en 346 is asserted because assertion of Scan_en 346 causes input 1 to be selected on muxes 315-1 and 315-2.

Further, in the initial phase—during the time from P1 to the time in P4 when Scan_en 346 is asserted—data on Scan_out 360 may either be (a) invalid as shown in waveform 362, or (b) logic 0, if scan in data from P1 to P4 is considered as an initial set of scan in data. For example, if the scan registers (e.g. R1 310-1, R2 310-2, R3 310-3, and R4 310-4) were previously reset prior to scanning, then, data on Scan_out 360 during P1 to P4 can be considered as valid data, and may comprise all "0" s.

Further, at time P4, scan has propagated via the scan chain to all inputs (e.g. A 320-1 (from R1 310-1), B 320-2 (from R2 310-2), C 320-3 (from R3 310-3), and D 320-4 (from R4 310-4)) of logic block 340 so that E:F 364 is valid as shown by waveform 366. Signals E:F 364 indicate when inputs to logic block 340 are valid so that logic block 340 can then be exercised (e.g. in a subsequent scan capture mode).

In FIG. 3B, at a time in P4 (e.g. when Clk 352 is at 0) Scan_en 346 is de-asserted (as shown in waveform 348) and circuit 300 is transitioned from shift mode to a scan capture mode. Further, as outlined above, at the time of scan in completion and prior to the time of de-assertion of Scan_en 346, input data (which was serially input from Scan_in 356 and has propagated to logic block inputs) A 320-1, B 320-2, C 320-3, and D 320-4 is available at logic block 340. Accordingly, during the scan capture phase, logic block operates on the input data (at logic block inputs A 320-1, B 320-2, C 320-3, and D 320-4) at the rising edge of Clk signal 352 (shown by the vertical heavy grey line).

Further, the input of Scan_in 356, which is shown by data label 1 in P1 in waveform 358, begins to appear at Scan_out 360 starting in P4 as indicated by data label 1 in waveform 362 and at rising clock edge of Clk 352 in P4, data of [E:F] 364 and In[0] 368 and In[1] 372 are valid. Scan_out 360 has valid data starting at P5, at the rising clock edge of Clk 352. as shown in waveform 362.

During the period when Scan_en 346 is de-asserted, a clock (e.g. rising edge of Clk 352, which initiates P5) is used to capture the data: (a) at nodes E and F into registers R3 310-3 and R4 310-4, respectively (in FIG. 3A), and (b) from In[0] and In[1] into registers R1 310-1 and R2 310-2. respectively (in FIG. 3A). For example, referring to FIG. 3A, while logic block 340 operates on inputs (to generate outputs [E:F] 364), input signals In[0] 315-1 and In[1] 315-2 may reflect a primary input or the output of some other blocks (e.g. coupled to In[0] 315-1 and In[1] 315-2) and these paths may form part of the scan test. Thus, during the scan capture cycle, when Scan_en 346 is de-asserted (e.g. as shown in waveform 348 in FIG. 3B, at a time in P4) and Clk 352 is active, data on [E:F] 364 can change because In[0]

368 and In[1] 372 are being captured through registers R1 310-1 and R2 310-2, so that inputs to logic block 340 could change.

Prior to time P5, with Clk 352 inactive and Scan_en 346 in a de-asserted state (FIG. 3B) and circuit 300 is in an operating (non-test) mode, input data (e.g. present on In[0] 368 and In[1] 372 via input 0 on muxes 315-1 and 315-2, respectively) may not be captured because the clock (e.g. rising edge of Clk 352) has not yet triggered data capture.

However, in P5, subsequent to the rising edge of Clk 352, only actual captured data of [E:F] 364 and In[0] 368 and In[1] 372 are of interest.

At a time in P5, Scan_en 346 is re-asserted and circuit 300 reverts to shift mode from the prior scan capture mode as shown in waveform 348. In shift mode, the scan chain is enabled and, in waveform 358, Scan_in 356 is shown (waveform 358) with input data (indicated by labels 5, 6, 7, 8) from a time in P5 (subsequent to assertion of Scan_en 346) to a time in P9 (when Scan_en 346 is next de-asserted).

Scan_out 360 has valid data from P5 through P8, as shown in waveform 362 as data from the scan capture phase appears serially at Scan_out 360 as shown in waveform 362.

Further, from P5 through P8 (during the time when Scan_en 346 is asserted), new scan input data (indicated by labels 5, 6, 7, and 8, in waveform 356 for Scan_in 358) propagates through the scan chain. Accordingly, data label 5 on Scan_in 356 appears on Scan_out 360 at a time in P9 as shown in waveform 362.

Data on E:F 364 is invalid subsequent to the rising edge of Clk 352 P5 and remains invalid subsequent to the assertion of Scan_en 366 through P8 as shown in waveform 366. Also, as outlined previously, data on In[0] 368 and In[1] 372 (waveforms 370 and 374, respectively) are ignored starting at the rising edge of Clk 352 at the start of P6 subsequent to the assertion of Scan_en 366 and while it remains asserted.

At a time in P9, Scan_en 346 is de-asserted again and circuit 300 transitions once again from shift mode to scan capture mode. Further, as outlined in relation to description of FIG. 3A above, prior to the time of de-assertion of Scan_en 346, input data (serially input from Scan_in 356 and indicated by labels 5, 6, 7, and 8 has propagated to logic block inputs) A 320-1, B 320-2, C 320-3, and D 320-4 is again available at logic block 340. Accordingly, during the scan capture phase, logic block operates on the input data (at logic block inputs A 320-1, B 320-2, C 320-3, and D 320-4) at the rising edge of Clk signal 352 (shown by the vertical heavy grey line) at the start of P10. Thus, logic block outputs E:F 364 have valid data starting at P9 as shown in waveform 366. Further, Scan_out 360 has valid data starting at P10 as shown in waveform 362.

As outlined above, when Scan_en 346 is de-asserted, a clock (e.g. rising edge of Clk 352, which initiates P10) is used to capture the data: (a) at nodes E and F into registers R3 310-3 and R4 310-4, respectively, and (b) from In[0] and In[1] into registers R1 310-1 and R2 310-2. respectively. Thus, in P10, subsequent to the rising edge of Clk 352, during the capture cycle, when Scan_en 346 is de-asserted and Clk 352 is active, logic block output [E:F] 364 may change because inputs (In[0] 368 and In[1] 372 captured through registers R1 310-1 and R2 310-2) to logic block 340 could change but these are invalid data (in P10, subsequent to the rising edge of Clk 352).

The cycle described above with: (1) Scan_en 346 asserted and serial data input via Scan_in 356 (scan in phase—e.g. as shown in waveform 348 from a time P10 to a time in P14 with serial data input via Scan_in 356 shown by data labels 9, 10, 11, and 12 in waveform 358), which is followed by (2) de-assertion of Scan_en 346 to exercise logic block 340 and capture output data (scan capture phase—e.g. starting at the rising edge of Clk 352, which initiates P15, when In[0] 368, In[1] 372 are captured, as shown in waveforms 370 and 374, respectively; and [E:F] 364 is valid, as shown in waveform 366), followed by (3) serial output on Scan_out 360 (scan out phase—e.g. starting at P15 with Scan_out 360 having valid data, as shown in waveform 362) may be repeated for different test vectors. Further, as outlined above, Scan_out data 360 may be captured and compared to expected values using ATE, with ATPG tools being used to lower the number of test vectors to test logic.

When logic block 340 is a fixed or known function (such as in an ASIC block), testing can be accomplished using the process described in relation to FIGS. 3A and 3B. However, unlike ASIC, PLDS such as FPGAs are user-programmable so that logic block 340 can vary depending on the user program.

Moreover, LUTs often use configurable memory in FPGAs to implement logic. Input values to a logic block X may be outputs of a first set of LUTs. For example, LUT outputs from a first set of LUTs may be used as the selection input(s) of one or more muxes to read a location in a second LUT and produce an output, which may be stored in a register Y. Therefore, testing logic block X may involve setting the inputs (which are outputs of the first set of LUTs) to logic block X to represent the desired test vectors. In addition, test vector support is also desirable for register Y (which holds the output of logic block X) because Y may be input to another logic block Z. Enabling scan test support for logic blocks in FPGAs would facilitate logic block testing via standard techniques and enhance reliability and confidence in the devices prior to deployment and/or after reprogramming.

Figure 4:
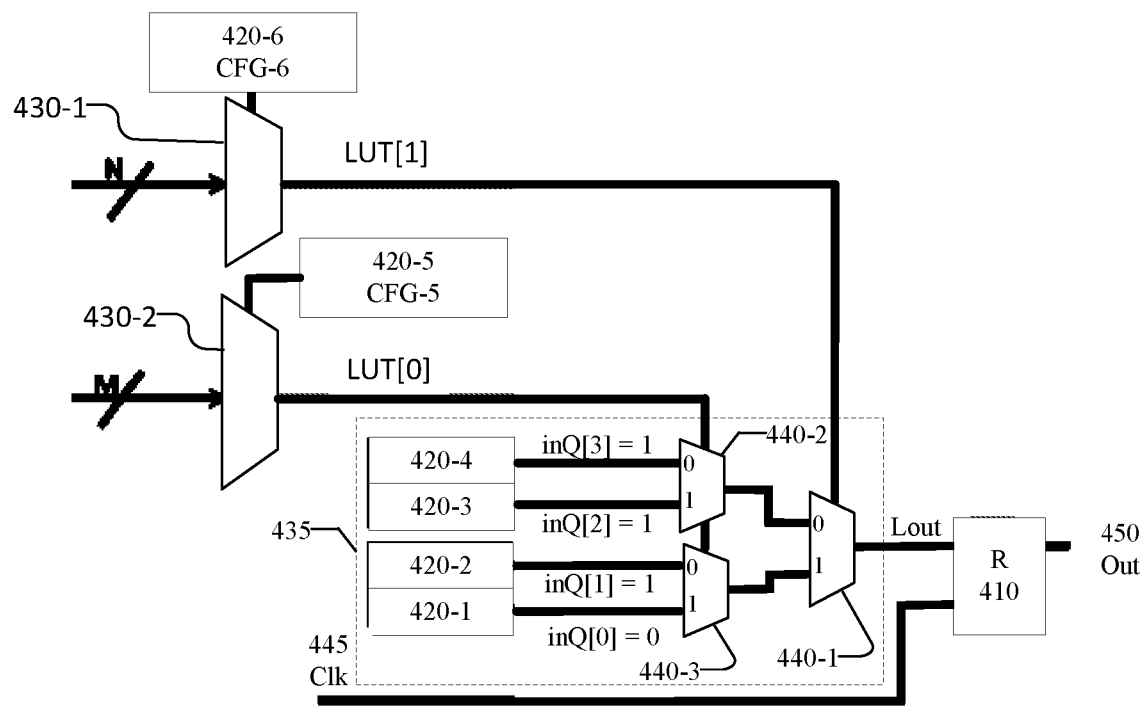
FIG. 4 shows a portion of an example logic block section to illustrate logic and signal flow in a PLD.

FIG. 4 shows a portion of an example logic block section 400 to illustrate logic and signal flow in a PLD. In FIG. 4, a first input to logic block section 400 may be coupled to mux 430-1, which may be used to select one of N inputs (e.g. from other logic blocks and/or sections external to logic block section 400) based on mux select input values stored in configuration LUT CFG-6 420-6. The output of mux 430-1, LUT[1] may be coupled to mux 440-1 as a select input.

Similarly, a second input to logic block section 400 may be coupled to mux 430-2, which may be used to select one of M inputs (e.g. from other logic blocks and/or sections external to logic block section 400) based on mux select input values stored in configuration LUT CFG-5 420-5. The output of mux 430-2, LUT[0] may be coupled to muxes 440-2 and 440-3 as a select input to each mux. Muxes 430-1 and 430-2 may be high fan-in multiplexers.

Configurable memory bits 420-1, 420-2, 420-3, and 420-4 are shown in FIG. 4 as storing values 0, 1, 1, 1, respectively. The values stored in configurable memory bits 420-1, 420-2, 420-3 form inputs inQ[0:3]=[0111], as shown in FIG. 4. Configurable memory bits 420 may form part of a configurable LUT 435 (shown within a dashed block in FIG. 4) and values of the configurable memory bits 420 may determine the output of the configurable LUT 435 for various inputs (such as LUT[0] and LUT[1] shown in FIG. 4). As shown in FIG. 4, configurable LUT 435 includes muxes 440-1, 440-2, and 440-3. Inputs LUT[0] and LUT[1] to configurable LUT 435 determine the output Lout of configurable LUT 435.

Table 1 below shows the value of Lout for different combinations of input signals LUT[0] and LUT[1], which also form select inputs to muxes 440-1, 440-2, and 440-3.

TABLE 1

Showing the value of Lout for different values
of LUT[1] and LUT[0]

| LUT[1] | LUT[0] | Lout |
|--------|--------|------|
| 0      | 0      | 1    |
| 0      | 1      | 1    |
| 1      | 0      | 1    |
| 1      | 1      | 0    |

As seen from Table 1 above, Lout is a logical NAND of inputs LUT[1] and LUT[0] and is implemented using values stored in configurable memory bits 420-1, 420-2, 420-3, and 420-4.

For example, (referring to FIG. 4) when signal LUT[0]=0, the 0 inputs of muxes 440-2 and 440-3 are selected. The 0 input of mux 440-2 is coupled to configurable memory bit 420-4, which holds a 1 (as indicated by inQ[3]=1) so that the output of mux 440-2 is 1. Similarly, 0 input of mux 440-3 is coupled to configurable memory bit 420-2, which holds a 1 (as indicated by inQ[1]=1) so that the output of mux 440-3 is 1. Accordingly, both the 0 and 1 inputs (which are the outputs of muxes 440-2 and 440-3, respectively) to mux 440-1 are 1, so that Lout is 1, whenever LUT[0] is 0, regardless of the state at LUT[1]

Conversely, when signal LUT[0]=1, the 1 inputs of muxes 440-2 and 440-3 are selected. The 1 input of mux 440-2 is coupled to configurable memory bit 420-3, which holds a 1 (as indicated by inQ[2]=1) so that the output of mux 440-2 is 1. Accordingly, if LUT[1] is 0, the 0 input of mux 440-1 (which is the output of mux 440-3) is selected and Lout is 1.

However, when signal LUT[0] is 1 and LUT[1] is also 1, then 1 input of mux 440-3, which is coupled to configurable memory bit 420-1, is selected. Configurable memory bit 420-1 holds a 0 (as indicated by inQ[0]-0) so that the output of mux 440-3 is 0. With signal LUT[1] being 1, the 1 input of mux 440-1 (corresponding to the output of mux 440-3) is selected and Lout is 0.

Thus, logic block section 400 obtains output Lout, which is a logical NAND of input signals LUT[0] and LUT[1]. Lout is stored in register R 410 and output as Out signal 450 on a clock edge of Clk signal 445 (e.g. to another logic block and/or logic block section).

In PLDs the configurable memory bits (which may form part of configurable LUTs) are often implemented as registers or latches or SRAM. Therefore, scan testing logic block section 400 would involve: (a) setting the mux inputs (which may be configurable LUT outputs) to desired test values and (b) enabling setting register R 410 to a desired value for testing. Thus, in many current PLDs, testing logic blocks can be cumbersome. Testing PLDs such as FPGAs may involve: (a) programming the PLD with a test configuration, and (b) using test vectors to obtain and compare output. Steps (a) and (b) may be repeated for different test configurations. Changes to a logic block and/or to configurable LUTs and/or configurable memory bits may also involve developing new test configurations.

Enabling scan test support for logic blocks in FPGAs would facilitate logic block testing via standard techniques and enhance reliability and confidence in the devices prior to deployment and/or after reprogramming. For example, enabling scan functionality support for configurable memory bits 420-1 through 420-6 and/or register 410 can facilitate testing of the logic block section 400 via standard scan test techniques.

Disclosed embodiments enable use of scan test techniques to test logic blocks within PLDs (such as FPGAs). In some embodiments, support for scan testing of configurable memory in PLDs is facilitated by techniques disclosed herein.

Figure 5A:
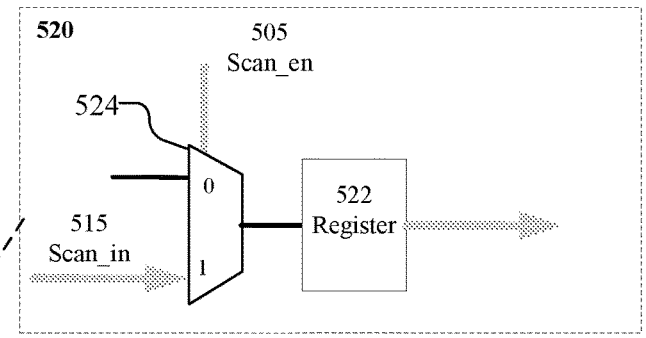
FIG. 5A shows an example scannable register, which may be used to support scan testing of logic blocks in PLDs.

FIG. 5A shows an example scannable register 520, which may be used to support scan testing of logic blocks in PLDs. The term "scannable register" (e.g. register 520) is used to refer to register (e.g. register 522) with input of the register (e.g. register 522) coupled to the output of a mux (e.g. mux 524) with a scan enable control input (e.g. Scan_en 505). When Scan_en is asserted (e.g. the device is in shift mode), the mux (e.g. mux 524) selects Scan_in (e.g. Scan_in 515) as serial input to the register (e.g. register 522) with the register (e.g. register 522) operating as a serial shift register. When Scan_en (e.g. Scan_en 505) is de-asserted (for example, in test mode during scan capture, or in normal non-test operation), input 0 on mux 524 is selected, and the register (e.g. register 522) functions normally. In a PLD device, for example, asserting Scan_en places the device into a shift mode where Scan_in input is serially scanned into the PLD scan chain (thicker light path in FIGS. 5A and 5B), while de-asserting Scan_en in test mode places the device into a scan capture mode (thinner dark path in FIGS. 5A and 5B).

Figure 5B:
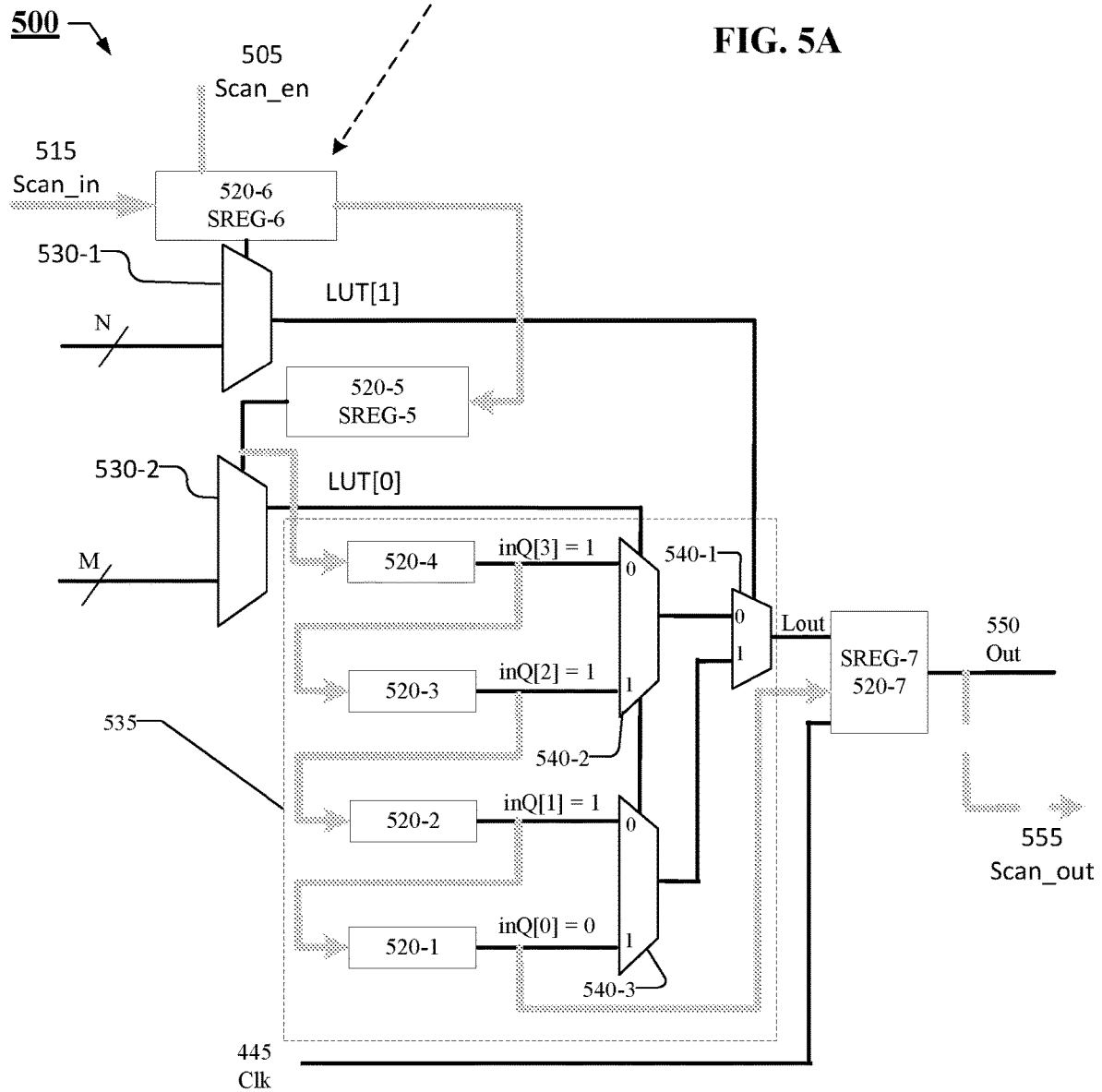
FIG. 5B shows an example logic block section in a PLD with support for scan testing according to some disclosed embodiments.

FIG. 5B shows an example logic block section 500 in a PLD with support for scan testing according to some disclosed embodiments. The output Lout of logic block section 500 may correspond to a NAND of LUT[0] and LUT[1] (as outlined earlier in relation to FIG. 4). In FIG. 5B, configurable LUT 535 (shown within a dashed block) may comprise configurable memory bits 520 and values of the configurable memory bits 520 may determine the output of the configurable LUT 535 for various inputs (such as LUT [0] and LUT[1] shown in FIG. 5B).

In FIG. 5B, configurable memory bits 520 may take the form of scannable registers. Like FIG. 4 described above, the output Lout of logic block section 500 is a logical NAND of inputs LUT[0] and LUT[1] and may be implemented using values stored in configurable memory bits 520-1, 520-2, 520-3, and 520-4. The normal signal flow (indicated by thinner dark lines in FIG. 5B) and functionality of logic block section 500 during normal operation is similar to that of logic block section 400 (FIG. 4). Accordingly, the description of normal operation of logic block section 500 is not repeated. The grey thicker lines shown for the scan test path and the thin dark lines shown for the scan capture mode operation path are merely illustrative and sections of the scan test path and normal operation path may overlap.

In some embodiments, logic block section 500 may include support for scan testing. For example, in conventional PLDs, which may use registers for configuration LUTs, the registers (e.g. in FIG. 4, when configurable memory bits 420 are implemented using registers) may be replaced by scannable registers (e.g. scannable register 520). For example, as shown in FIG. 5B, scannable registers SREG 520 (e.g. as shown in FIG. 5A) may be used for configuration LUTs.

Referring to FIG. 5B, when Scan_en 505 is asserted, data on Scan_in input 515 may be stored by SREG-6 520-6 (e.g. on a rising clock edge). As shown in FIG. 5B, the Scan_in 515 serial input data may be clocked in and flow from SREG-6 520-6 through the scan chain (shown in lighter lines). along a path comprising SREG-5 520-5, SREG-4 520-4, SREG-3 520-3, SREG-2 520-2, and SREG-1 520-1. SREG-7 520-7 may also receive data, via the scan chain when Scan_en is enabled. As outlined above, during normal operation the scan path is disabled and logic block section 500 is in normal operating mode. Accordingly, SREG-7 520-7 receives the output Lout of logic block section 500 during normal operation.

Accordingly, when the configurable memory bits 520 along the scan chain (e.g. SREG-6 520-6, SREG-5 520-5, SREG-4 520-4, SREG-3 520-3, SREG-2 520-2, and SREG-1 520-1) have valid data, Scan_en 505 may be de-asserted to exercise the logic in example logic block section 500 and obtain Lout. Scan_en 505 may then be re-asserted to enable Lout to be output serially via Scan_out 555, which may be captured and compared to expected values using ATE. Thus, example logic block section 500 in a PLD may support scan testing. In some embodiments, the support for scan testing may involve using scannable registers for configurable memory bits, which, in some instances, may form part of configurable LUTs.

Figure 6A:
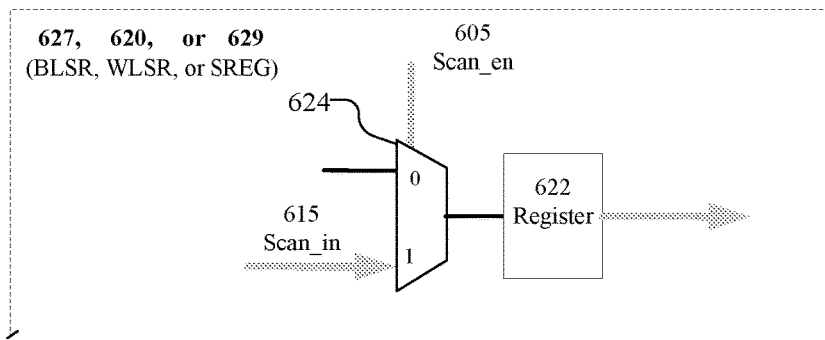
FIG. 6A shows an example scannable register, which may be used to support scan testing of logic blocks in PLDs.

FIG. 6A shows an example scannable register, which may be used to support scan testing of logic blocks in PLDs. As indicated in FIG. 6A, in some embodiments, scannable registers may be used for Word Line Shift Register (WLSR) 620, Bit Line Shift Register (BLSR) 627, and/or SREG 629.

As outlined previously, scannable registers (e.g. WLSR 620, BLSR 627, and/or SREG 629) may include a register (e.g. 622) with input of the register (e.g. register 622) coupled to the output of mux (e.g., mux 624) with a scan enable control input (e.g. Scan_en 605), which, when asserted, selects Scan_in (e.g. Scan_in 615) as serial input to the register (e.g. register 622) with the register (e.g. register 622) operating as a serial shift register. When Scan_en (e.g. Scan_en 605) is de-asserted (for example, in test mode during scan capture, or in normal non-test operation) input 0 on mux 624 is selected and the register (e.g. register 622) functions normally. In a PLD device, for example, asserting Scan_en 605 places the device into a shift mode where Scan_in input is serially scanned into the PLD scan chain (thicker light path in FIGS. 6A and 6B), while de-asserting Scan_en in test mode places the device into a scan capture mode (thinner dark path in FIGS. 6A and 6B). The grey thicker lines shown for the scan test path and the thin dark lines shown for the scan capture mode operation path are merely illustrative and sections of the scan test path and normal operation path may overlap.

Figure 6B:
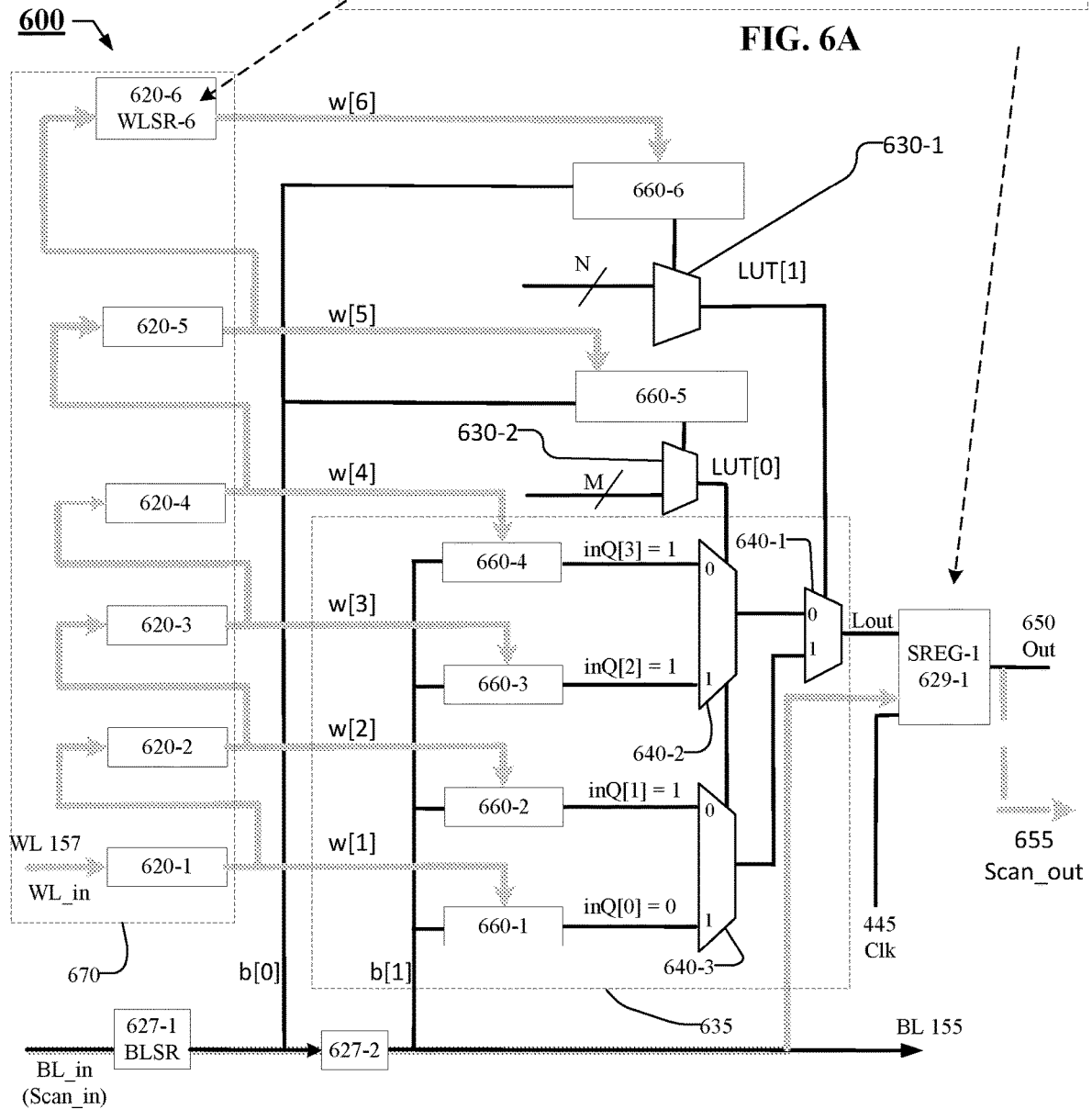
FIG. 6B shows an example logic block section in a PLD with support for scan testing according to some disclosed embodiments.

FIG. 6B shows an example logic block section 600 in a PLD 150 with support for scan testing according to some disclosed embodiments. Logic block section 600 may form part of CLB 156, SB 167, and/or any other section of PLD 150, where latch-based configurable memory bits (e.g. configurable memory bits 660) and/or latch-based configurable LUTs (such as configurable LUT 635) are used to implement logic functions. Further, as outlined in relation to FIG. 6A, registers such as WLSR 620, BLSR 627, and/or SREG 629 may be scannable registers.

The output Lout of logic block section 600 may correspond to a NAND of LUT[0] and LUT[1] (as outlined earlier in relation to FIG. 4). In FIG. 6B, configurable LUT 635 may comprise configurable memory bits 660 and values of the configurable memory bits 660 may determine the output of the configurable LUT 535 for various inputs (such as LUT[0] and LUT[1] shown in FIG. 6B).

In FIG. 6B, configurable memory bits 660 may take the form of latches. When configurable memory bits 660 are implemented as latches, a word line (WL) (e.g. WL 157) and bit line (e.g. BL 155) configuration is used to program the latch. For example, a corresponding WL 157, when asserted, may be used to enable a configurable memory bit (latch) 660 for writing, while BL 155 provides data (shown as BL_in in FIG. 6B) to the configurable memory bit (latch).

Signals on WL 157 and BL 155 are driven by WLSRs 620 and BLSRs 627, respectively. During normal programming (e.g. when Scan_en is de-asserted), a bitstream may be serially loaded into BLSRs 627 and WLSR 620 is configured to assert a corresponding WL 157, when data in BLSR 627 is valid. Data on BL 155 is then loaded to configurable memory bits 660.

When Scan_en 605 is asserted, the PLD (e.g. PLD 150) may be placed into a scan test shift mode and the scan path (portions shown by the thicker grey lines in FIGS. 6A and 6B) may be activated. As shown in FIG. 6B, logic block section 600 may comprise two distinct chains. The WLSR chain 670 may serve to enable writes to configurable memory bits 660 (which may be implemented as latches), while the BLSRs 627 drive scan test vector data on BLs b[0] and b[1], which are written to the write enabled configurable memory bits 660. For example, WL_in may be set to "1" and propagate through WLSR 620-1 to assert w[1] when BLSR 627-2 drives b[1] so that data is written to configurable memory bit 660-1. At the next clock, WL_in may be shifted to WLSR 620-2 to assert w[2] when BLSR 627-2 drives b[1] so that data is written to configurable memory bit 660-2. The process may repeat until corresponding portions (bits) of the test vector have been loaded into the corresponding configurable memory bits (e.g. 660-1 through 660-4). WL_in input data may then be shifted to WLSR 620-5 to drive w[5] and enable writes to configurable memory bit 660-5 when BLSR 627-1 drives b[0]. Finally, in FIG. 6B, the input data may be shifted to WLSR 620-6 to drive w[6] and enable writes to configurable memory bit 660-6 when BLSR 627-1 drives b[0].

In some embodiments, when Scan_en 605 is asserted, mux 624 in scannable registers WLSR 620, BLSR 627, and SREG-1 629-1 may select input 1 (scan path) and input corresponding to: (a) the scan test vector may be serially scanned in as BL_in over BL 155; and (b) WL_in (logical "1") may be input over WL 157 and serially scanned in (e.g. from WL_in→WLSR 620-1→WLSR 620-2→WLSR 620-3→WLSR 620-4→WLSR 620-5→WLSR 620-6). Because WLSR 620-j enables the writing of data in BLSR 627-1 or 627-2 to the corresponding configurable memory bit 660-j (latch) when WLSR 620-j asserted, the selective assertion of the w[ ] signals can be used to write scan test data from BLSR 627 into the corresponding configuration LUT as outlined above. For example, when w[1] is 1, b[1] is written to configuration LUT 660-1. Similarly, when w[2], w[3], or w[4] are 1, the data b[1] on BL 155 is written to configuration LUTs 620-2, 620-3, or 620-4, respectively. Likewise, when WLSR 620-5 and w[5] are 1, or WLSR 620-6 and w[6] are 1, the data b[0] on BL 155 (from BLSR 627-1) is written to configuration LUTs 660-5 and 660-6, respectively.

Like FIG. 4 described above, the output Lout of logic block section 600 is a logical NAND of inputs LUT[0] and LUT[1] and is implemented using values stored in configurable memory bits 660-1, 660-2, 660-3, and 660-4, which form part of configurable LUT 635. The normal signal flow (indicated by thinner dark lines in FIG. 6B) and functionality of logic block section 600 during normal operation is similar to that of logic block section 400 (FIG. 4). Accordingly, the description of normal operation of logic block section 600 is not repeated.

In some embodiments, as outlined above, logic block section 600 may include support for scan testing. In some embodiments, the scan pattern, may determine values of configurable memory bits 660. Further, configurable memory bits 660 may form: (a) inputs to muxes (e.g. such as muxes 640) and/or (b) form select (or control) inputs of the muxes (for example, to select one of a number of mux inputs).

The WLSR scan chain 670 may enable writes to configurable memory bits (which may be latch-based—i.e. implemented as latches), while scan test data may be input via the BLSR 627 and SREG 629-1 scan chain, shifted onto bit lines, and used to write data into configurable memory bits 660 (when the corresponding WL 157 is asserted).

Referring to FIG. 6B, when Scan_en 605 is asserted, data b[0] from BLSR 627-1 or b[1] from BLSR 627-2 may be written to a corresponding configurable memory bit (e.g. one of configurable memory bits 660-j) whose word line w[j] is asserted. Once a test pattern has been loaded into configurable memory bits 660 (e.g. during a scan capture phase), Scan_en 605 may be de-asserted to exercise the logic in example logic block section 600 and obtain Lout. Scan_en 605 may then be re-asserted (e.g. during a scan out phase) to enable Lout to be output serially via Scan_out 655, which may be captured and compared to expected values using ATE. Thus, example logic block section 600 in a PLD may support scan testing. In some embodiments, when configurable memory bits 660 are implemented using latches, the support for scan testing may involve using a word line shift register (WLSR) chain 620-j to enable writing to a corresponding configurable memory bit 660-j, while driving data into the configurable memory bit 660-j via a scannable chain that includes scannable bit line shift registers (BLSRs) when the corresponding write enable signal is asserted.

Accordingly, in some embodiments, a programmable logic device (PLD) (e.g. such as FPGA 150) may comprise: a scan enable input (e.g. Scan_en 605), wherein, when the scan enable input is asserted, the PLD enters a (scan test) shift mode; and at least one first logic block section (e.g. logic block section 600). The at least one first logic block section (e.g. logic block section 600) may comprise: (i) a plurality of latch-based configurable memory bits (e.g. configurable memory bits 660), (ii) a plurality of scannable individual word line shift registers (WLSRs) (e.g. WLSRs 620), wherein the plurality of individual scannable WLSRs form a first scan chain (e.g. 670) in shift mode (e.g. when Scan_en 605 is asserted), wherein each scannable WLSR (620-j) is coupled to and drives at least one corresponding word line (WL) (e.g. w[j]), wherein a first WLSR (e.g. 620-1) in the first scan chain is coupled to a WL input (WL_in), (iii) a plurality of word lines (WLs) (WL 157, w[1]-w[6]), wherein each WL (e.g. w[j]) is: (a) associated with at least one corresponding configurable memory bit (e.g. 660-j), and (b) enables writes to the at least one corresponding configurable memory bit (e.g. 660-j) when the associated WL (e.g. w[j]) is asserted, (iv) at least one scannable bit line shift register (BLSR) (e.g. BLSRs 627) to receive a section of a scan test vector (Scan_in/BL_in) in shift mode, and drive at least one corresponding bit line (BL) (e.g. BL 155, b[0], b[1])), and (v) at least one bit line (BL) (e.g. BL 155, b[0], b[1])) coupled to the at least one BLSR (e.g. BLSRs 627-1, 627-2) and to the plurality of configurable memory bits (660) wherein, when the PLD is in shift mode, data on the BL (e.g. b(0) or b(1)] is written into a corresponding configurable memory bit (660-j), when the associated WL (e.g. w[j]) is asserted. In some embodiments, the section of the serial scan test vector (e.g. Scan_in/BL_in) may be received from an Automatic Test Pattern Generator (ATPG). In some embodiments, the scan enable input may be de-asserted during scan capture mode and/or during non-test mode operation of the PLD. In some embodiments, the configurable memory bits (e.g. 660) may form part of a configurable LUT (e.g. configurable LUT 635).

In some embodiments, the at least one first logic block section (e.g. logic block section 600) may further comprise (vi) an output scannable register (e.g. SREG-1 629-1), wherein the output scannable register (e.g. SREG-1 629-1) is coupled to a BLSR (e.g. BLSR 627-2) in shift-mode (e.g. when Scan_en 605 is asserted) and wherein the output scannable register (e.g. SREG-1 629-1) stores an output of the logic block section (e.g. 600) when in scan capture (or non-test) mode (e.g. Scan_en 605 is de-asserted).

In some embodiments, the at least one first logic block section may form part of one or more of: (a) a configurable logic block, or (b) an input-output block, or (c) a switching block, or (d) a connection block, or (d) a combination thereof.

In some embodiments, the PLD may further comprise one or more scannable registers (e.g. SREG-1 629-1), wherein the at least one scannable BLSR and the one or more scannable registers either form part of the first scan chain (e.g. 670), or form part of one or more second scan chains distinct from the first scan chain. In some embodiments, the scan vector may, thus, form a first section input to the WLSRs, a second section input to BLSRs, etc. As outlined previously, in some embodiments, the scannable WLSR, scannable BLSR, and output scannable register may form a single chain.

In some embodiments, the at least one first logic block section may further comprise a WL input, wherein data received on the WL input is shifted serially between the linked scannable WLSRs to enable assertion of the associated WL by the corresponding scannable WLSR when the data on the BL is written into the corresponding configurable memory bit.

The at least one BLSR (e.g. BLSRs 627) and the output scannable register (e.g. SREG-1 629-1) may form part of at least one first scan chain. In embodiments with multiple scan chains, a multiplexer may be used to select an appropriate scan chain.

As outlined in FIG. 6A, each scannable BLSR (e.g. 627) may comprise a corresponding multiplexer (e.g. 624) coupled to a corresponding register (e.g. 622), wherein the corresponding multiplexer (e.g. 624) is configured to select and forward the serial test vector input (e.g. Scan_in 615, input 1 on mux 624) to the register (e.g. 622) when in shift mode (Scan_en 605 is asserted).

In some embodiments, the at least one logic block section (e.g. 600) may further comprise a WL input, wherein data (e.g. WL_in) received on the WL input (e.g. WL 157) is shifted serially between the linked individual scannable WLSRs (e.g. WLSRs 620) to enable assertion of associated WL (e.g. w[j]) when the data on the at least one BL (e.g. BLs 155, b[0] or b[1]) is written into the corresponding configurable memory bit (e.g. 660[j]).

In some embodiments, scan enable input (e.g. Scan_en 605) may be de-asserted (e.g. during a scan capture phase) to exercise the logic block section (e.g. 600) when the plurality of configurable memory bits (e.g. 660) have been configured with a corresponding portion of the serial scan test vector input.

In some embodiments, the PLD may be comprised in an Integrated Circuit (IC).

Figure 7:
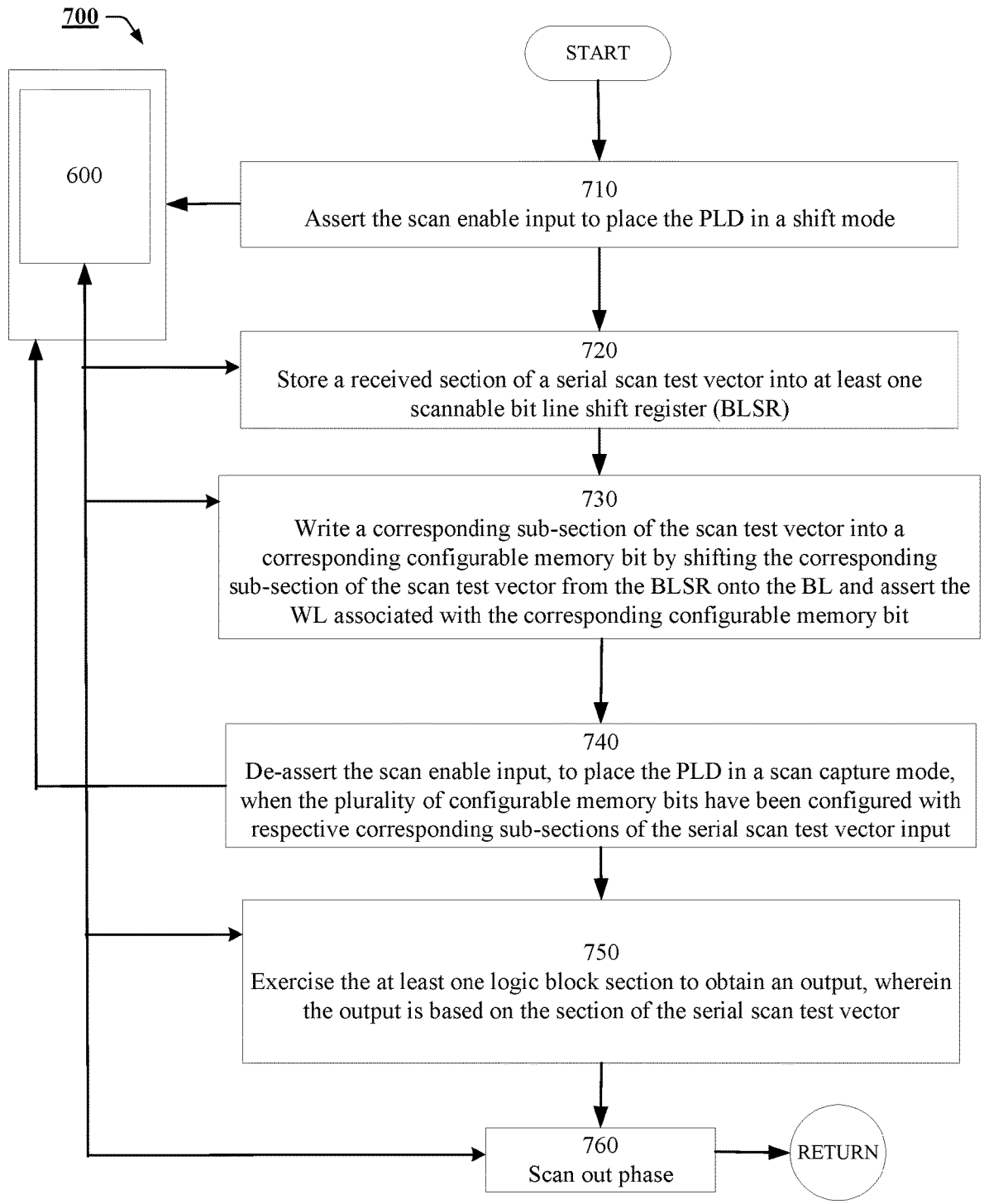
FIG. 7 shows a flowchart outlining a method of testing a PLD with a scan enable input and at least one logic block section.

FIG. 7 shows a flowchart outlining a method 700 of testing a programmable logic device (PLD) (such as the PLD 600 shown in FIG. 6B), wherein the PLD 150 may comprise a scan enable input (e.g. Scan_enable 605), and at least one logic block section (e.g. logic block section 600).

The at least one logic block section (e.g. logic block section 600) may comprise: (i) a plurality of latch-based configurable memory bits (e.g. latch-based configurable memory bits 660), (ii) a plurality of scannable word line shift registers (WLSRs) (e.g. WLSRs 620), wherein the plurality of scannable WLSRs form part of a distinct scan chain (e.g. WLSR chain 670) in shift mode, (iii) a plurality of word lines (WLs) (e.g. WLs 157, w[1]-w[6]), wherein each WL (e.g. w[j]) is: (a) associated with a corresponding configurable memory bit (e.g. configurable memory bit 660-$j$), and (b) enables writes to the corresponding configurable memory bit (e.g. configurable memory bit 660-$j$) when the associated WL (e.g. w[j]) is asserted by a corresponding WLSR (e.g. WLSR 620-$j$) in the plurality of WLSRs, (iv) at least one scannable bit line shift register (BLSR) (e.g. BLSR 627) to receive a section of a scan test vector (e.g. as Scan_in) in shift mode; and (v) at least one bit line (BL) (e.g. BLs 155, b[0], b[1]) coupled to the at least one BLSR (e.g. 627-1, 627-2) and to the plurality of configurable memory bits (e.g. configurable memory bits 660). In some embodiments, the section of the serial scan test vector may be received from an Automatic Test Pattern Generator (ATPG) tool.

In some embodiments, the method may be performed by a processor on Automated Test Equipment (ATE).

In some embodiments, method 700 may comprise, in step 710, asserting a scan enable input (e.g. Scan_enable 605) to place the PLD (e.g. PLD 150) in a shift mode.

In step 720, the received section of the serial scan test vector (e.g. Scan_in) may be stored into the at least one scannable bit line shift register (BLSR) (e.g. BLSR 627-1, 627-2)

In step 730, a corresponding sub-section of the scan test vector input may be written into a corresponding configurable memory bit (e.g. 660-$j$) by shifting the corresponding sub-section of the scan test vector input from the at least one BLSR onto the at least one BL and asserting the WL (e.g. w[j]) associated with the corresponding configurable memory bit (e.g. 660-$j$).

In step 740, the PLD may be placed into a scan capture mode by de-asserting the scan enable input when the plurality of configurable memory bits (e.g. 660[1] through 660[6]) have been configured with respective corresponding sub-sections of the serial scan test vector input (e.g. scan in is complete).

In step 750, (e.g. which may form part of a scan capture phase) the at least one logic block section may be exercised to obtain an output of the logic block section, wherein the output of the at least one logic block section is based on the section of the serial scan test vector.

In block 760, a scan out phase may be initiated. In the scan out phase, the scan enable input may be re-asserted to place the PLD in a shift mode again and serial output of the output of the at least one logic block section (e.g. obtained in step 750) may be initiated from an output scannable register (e.g. SRGE-1 629-1) comprised in the at least one logic block section. The output scannable register may be coupled to the BLSR in test-mode and, in operating (non-test) mode, the output scannable register may store the output of the at least one logic block section. The scannable output register may comprise a corresponding multiplexer coupled to a corresponding register, wherein the corresponding multiplexer is configured to select and forward the serial scan test vector input data from the BLSR to the register when in shift mode.

Likewise, in some embodiments, the scannable BLSR and the output scannable register may form part of a second scan chain. Each scannable BLSR may comprise a corresponding multiplexer coupled to a corresponding register, wherein the corresponding multiplexer is configured to select and forward the serial scan test vector input data from the BLSR to the register when in shift mode. In some embodiments, the scannable WLSR, scannable BLSR, and output scannable register may form a single chain.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A programmable logic device (PLD) comprising:
a scan enable input, wherein, when the scan enable input is asserted, the PLD enters a shift mode; and
at least one first logic block section, wherein the at least one first logic block section comprises:
a first configurable memory bit coupled to a scan chain in the shift mode;
a first multiplexer (MUX) with a first select input directly coupled to the first configurable memory bit; and
a configurable look up table (LUT) including:
a first plurality of configurable memory bits coupled in series along the scan chain in the shift mode and coupled to the first configurable memory bit; and
a plurality of MUXes, the plurality of MUXes being coupled to each of the first plurality of configurable memory bits and to an output of the first MUX.

2. The PLD of claim 1, wherein the first configurable memory bit and each configurable memory bit of the first plurality of configurable memory bits is a scannable register.

3. The PLD of claim 2, wherein each scannable register includes a register coupled to an output of a scannable register MUX, the scan enable input being directly coupled to a first select input of each scannable register MUX.

4. The PLD of claim 1, comprising a scan in input coupled to the first configurable memory bit.

5. The PLD of claim 4, wherein data from the scan in input is stored in the first configurable memory bit along the scan chain.

6. The PLD of claim 1, wherein, when the scan enable input is de-asserted in a test mode, the PLD enters a scan capture mode.

7. The PLD of claim 1, wherein the scan chain is disabled when the scan enable input is de-asserted during a normal, non-test operation.

8. The PLD of claim 1 comprising a second MUX coupled between a first of the first plurality of configurable memory bits and a second of the first plurality of configurable memory bits along the scan chain, an output of the second MUX being directly coupled to one of the plurality of MUXes.

9. The PLD of claim 1, comprising a second configurable LUT coupled directly to the select input of the first MUX.

10. An integrated circuit comprising:
a programmable logic device (PLD), wherein the PLD comprises:
a scan enable input, wherein, when the scan enable input is asserted, the PLD enters a shift mode; and
at least one first logic block section, wherein the first logic block section includes:
a first configurable memory bit coupled to a scan chain in the shift mode;

a first multiplexer (MUX) with a first select input directly coupled to the first configurable memory bit; and a first configurable look up table (LUT) including a first plurality of configurable memory bits coupled in series along the scan chain in the shift mode and coupled in series to the first configurable memory bit, a second MUX with a select input directly coupled to the first MUX, and a third plurality of MUXes, the third plurality of MUXes each including:

a first input coupled to one of the first plurality of configuration memory bits; and a second input coupled to a different one of the first plurality of configuration memory bits than the first input of the third plurality of MUXes.

11. The integrated circuit of claim 10, wherein the first MUX selects one of a plurality of inputs based on a plurality of MUX select input values stored in the first configurable memory bit.

12. The integrated circuit of claim 10, comprising a fourth MUX with a select input coupled between two of the first plurality of configurable memory bits and an output coupled to a select input of one of the third plurality of MUXes.

13. The integrated circuit of claim 10, wherein a select input of each of the third plurality of MUXes is coupled to a select input of another of the third plurality of MUXes.

14. The integrated circuit of claim 10, wherein an output of each of the third plurality of MUXes is an input of the second MUX.

15. The integrated circuit of claim 10, wherein an output of the second MUX is directly coupled to one of the first plurality of configurable memory bits.

16. The integrated circuit of claim 15, comprising a second configurable LUT coupled directly to the select input of the first MUX.

17. The integrated circuit of claim 16, wherein the output of the second MUX is a logical NAND of an input signal of the first configurable LUT and an input signal of the second configurable LUT.

18. A method, comprising:
operating a programmable logic device (PLD) in a shift mode, the PLD including a scan enable input, and at least one logic block section, wherein the at least one logic block section includes:
a first configurable memory bit coupled to a scan chain in the shift mode and including a first register and a first scannable register multiplexer (MUX);
a first MUX with a first select input coupled to the first of configurable memory bit; and
a first configurable look up table (LUT) including:
a first plurality of configurable memory bits coupled in series along the scan change in the shift mode, each configurable memory bit of the first plurality of configurable memory bits including a second register and a second scannable register MUX; and
a plurality of MUXes coupled to each of the first plurality of configurable memory bits and to the first MUX;
a second MUX coupled to the first MUX, coupled to the first configurable LUT;
activating the shift mode in the PLD by asserting the scan enable input;
storing data from the scan in input into the first configurable memory bit;
activating a scan capture mode in the PLD by de-asserting the scan enable input.

19. The method of claim 18, wherein a last one of the first plurality of configurable memory bits in the scan chain is coupled with a clock signal and the data from the scan in input is stored on a rising edge of the clock signal.

20. The method of claim 18, further comprising:
reasserting the scan enable input thereby activating the PLD in the shift mode; and
serially outputting an output of the second MUX via a scan out signal; and
capturing and comparing the output of the second MUX to expected values.

* * * * *